United States Patent [19]
Anderson

[11] Patent Number: 5,982,147
[45] Date of Patent: Nov. 9, 1999

[54] SYSTEM FOR DISPLAYING A STATUS CONDITION OF A BATTERY

[75] Inventor: Eric D. Anderson, Hudson, Wis.

[73] Assignee: Micron Electronics, Inc., Boise, Id.

[21] Appl. No.: 09/007,368

[22] Filed: Jan. 15, 1998

[51] Int. Cl.⁶ ..................................................... H02J 7/00
[52] U.S. Cl. ............................................. 320/132; 320/130
[58] Field of Search ..................................... 320/132, 130, 320/149, 128

[56] References Cited

U.S. PATENT DOCUMENTS

| | | | |
|---|---|---|---|
| 5,600,230 | 2/1997 | Dunstan | 320/DIG. 21 |
| 5,714,870 | 2/1998 | Dunstan | 320/DIG. 21 |
| 5,818,200 | 10/1998 | Cummings et al. | 320/116 |
| 5,850,134 | 12/1998 | Oh et al. | 320/106 |
| 5,870,685 | 2/1999 | Flynn | 320/128 |

OTHER PUBLICATIONS

Smart Battery Charger Specification, Revision 1.0, Jun. 27, 1996.
Smart Battery Data Specification, Revision 1.0, Feb. 15, 1995.
System Management Bus BIOS Interface Specification, Revision 1.0, Feb. 15, 1995.
System Management Bus (SMBus) Description. World Wide Web http://www.sbs–forum.org/smbdef.htm.

*Primary Examiner*—Peter S. Wong
*Assistant Examiner*—Lawrence Luk
*Attorney, Agent, or Firm*—Knobbe, Martens Olson & Bear, LLP

[57] ABSTRACT

A system for displaying a status condition of a smart battery. The system includes: a charging unit for receiving and charging the smart battery; a first data bus, located within the charging unit and coupled to a microprocessor located within the smart battery; a bus interface for coupling the first data bus to a second data bus; a computer having the second data bus therein, the computer further including a central processing unit, coupled to the second data bus, for receiving data from the smart battery, and a display screen, coupled to the central processing unit, for displaying the status condition of the smart battery, wherein the charging unit is external to the computer.

24 Claims, 2 Drawing Sheets

SYSTEM FOR DISPLAYING A STATUS CONDITION OF A BATTERY

RELATED APPLICATIONS

This application is related to a commonly-owned and co-pending U.S. patent application entitled, "Method of Displaying a Status Condition of a Battery," U.S. application Ser. No. 09/007,369, which is filed concurrently herewith.

BACKGROUND OF THE INVENTION

Definitions:

smart battery: A battery equipped with specialized hardware that provides present state, calculated and predicted information to a battery charger or a SM bus Host under software control. As used herein, the term "smart battery" refers to any type of battery which contains circuitry to determine and communicate information/data related to a condition of the battery to an external circuit.

smart battery charger: A battery charger that periodically communicates with a smart battery and alters its charging characteristics in response to information provided by the smart battery.

SM bus: The System Management Bus is a specific implementation of an inter-integrated circuit ($I^2C$) bus that describes data protocols, device addresses and additional electrical requirements, designed to physically transport commands and information between the smart battery, SM bus Host, smart battery charger and other smart Devices.

SM bus Host: A piece of portable electronic equipment, such as a lap-top or notebook computer, powered by a smart battery. It is able to communicate with the smart battery and use information provided by the battery.

Status Condition: A condition related to a smart battery which includes, but is not limited to: percentage (%) charge, time remaining to fully charge, maximum current amplitude to charge, maximum voltage amplitude to charge, and the duration of time the battery is able to supply power to a device at a specified power consumption rate.

FIELD OF THE INVENTION

The invention relates to batteries, and more particularly, to a method and system for determining a status condition of a smart battery being charged in a smart battery charger which is external to a computer system.

DESCRIPTION OF THE RELATED TECHNOLOGY

In many battery-powered systems today, a user never knows how much charge is left in the battery. While the user may translate this to the simple question "How long will this device continue to operate?"—the answer is complex. Many products that attempt to answer the question use the system's hardware to measure the battery's charge state. This approach is unreliable when different types of batteries are used because the battery's characteristics and history are associated with the particular system, not the battery. The system's hardware typically does not take into account the different chemistries, different charge states, different discharge rates, etc., found in different types of batteries. The smart battery addresses this problem by maintaining its own information, thus allowing for a mixture of batteries (different chemistries, different charge states, etc.) to be used in a device. Thus, the smart battery can provide accurate information to a user because it can accurately report its own characteristics.

Take, for example, the operation of a laptop computer. A user may have multiple batteries each with different capacities as well as different charge states to power the laptop computer. Even with an accurate state-of-charge indication, the laptop computer may not be able to distinguish between different types of batteries. For example, a full one AH (ampere hour) battery is not equivalent to a full 1.5 AH battery. Though they both can power the same computer, what the user wants to know is whether or not either of these batteries has adequate capacity to power the computer for one hour. The smart battery can provide the user with accurate state of charge information along with an accurate prediction of the remaining operating time.

A smart battery charger is a charging circuit that periodically polls the smart battery for its charging characteristics then adjusts its output to match the smart battery's requirements. This allows the battery to control its own charge cycle. The smart battery charger can also receive signals identifying critical events from the smart battery when the battery detects a problem. These include alarms for: overcharge, over-voltage, over-temperature and a temperature which is increasing too rapidly. Smart battery charger to smart battery communications are performed:

To allow smart batteries to be charged as rapidly and as safely as possible

To allow new and different battery technologies to be used in existing equipment To allow access to the "correct" charger algorithm for the battery Currently existing technology allows a laptop computer to communicate with a smart battery which is supplying power to the computer. By executing commercially available software programs, the computer can request information from the battery and then use the information in the system's power management scheme and/or provide the information to a user of the computer. The laptop computer can also receive critical events from the smart battery when it detects a problem. For example, the laptop may receive alarms for end of discharge, remaining charge capacity below a user set threshold value, and remaining run time below a user set threshold value. One example of a software program which allows a computer to communicate with a smart battery is the BatteryScope™ program, designed and manufactured by Phoenix Technologies, Ltd., having a headquarters located at San Jose, Calif.

The laptop computer can communicate with the smart battery to get data that is either presented to the user or to the computer's power management system. The user can get two types of data from the battery: factual data and predictive data. Factual data can be measured, such as temperature, pack voltage or charge/discharge current, or it can be a battery characteristic, such as the battery's chemistry. Predictive data is calculated, based on the battery's present state and the battery's characteristics, such as the battery's remaining life at the present rate of drain. Additionally, since the battery has a clock, information can be presented as a rolling average over a fixed interval.

Thus, a laptop computer can communicate with a smart battery in order to accomplish the following tasks:

To allow the user to know the smart battery's remaining life

To tell the user how long it will take to charge the smart battery

To allow smart batteries to provide accurate information to their user

To determine the laptop computer's real-time power requirements

To enable power management based on "real" information supplied by the battery

To enable battery manufacturers to collect information about a smart battery's usage Communications between the smart battery, the laptop computer and the smart battery charger are typically performed across a system management bus (SM bus). The SM bus is an industry standard defined for the purpose of allowing intelligent charging circuitry to communicate with intelligent batteries to control the charging of batteries efficiently. The SM bus also provides the system CPU with the ability to communicate with the battery to determine the amount of charge present on it, so this information can be made available to the user.

The SM bus was developed to enable an inexpensive, yet powerful, method for controlling and getting information from devices on a computer motherboard. One of the goals was to be able to design hybrid devices based on analog semiconductor technologies and with limited digital capabilities. To this end many of the commands defined by SM bus are geared for simple logic implementations. SM bus devices do not need to implement all of the commands defined in the SM bus specification. For example, smart batteries only use "Read/Write Word" and "Read Block" commands. This makes implementing an SM bus driver for smart Batteries much easier. Smart batteries are free to use any SM bus command such as "Write Block," to implement custom functions. Write Block is typically used during the manufacturing process to initialize the battery data, e.g. mfg. date, serial number, electronics trimming and scaling values etc.

Each device on the SM bus may have a unique address. When a device "sees" it's address, it wakes up and responds to the rest of the command. Each address is typically seven bits long with a read/write bit appended in bit position 0, thus 127 devices may be addressed with one address reserved for a universal address. Since each device may have its own protocol and all addresses may be unique, each device may also have its own set of commands. Note: there is nothing to prevent a device from creatively using the read and write block protocols to generate a plethora of commands, however the bus may not be well-suited for very complex or frequent transactions.

The SM bus is a two-wire interface through which simple power-related chips can communicate with the rest of the system. The SM bus uses the inter-integrated circuit ($I^2C$) bus communication protocol, which is well-known in the industry, as its backbone. A system using the SM bus passes messages to and from devices instead of tripping individual control lines. Removing the individual control lines reduces pin count. Accepting messages ensures future expandability.

It is common for laptop, or notebook, computers today to take advantage of smart battery technology to communicate with a microcomputer present in the smart battery used to power the notebooks for the purpose of informing the user how much battery life is left. This is done with software utilities which obtain this information from the batteries and then convert this information to visible feedback such as a gauge and/or numerical percent charge present on the battery. Thus, current smart battery technology allows a portable, laptop computer to interrogate a battery which is supplying power to the computer.

However, this level of interaction is not currently available with a smart battery which is charging in an external charging bay. Presently, the only visual feedback which indicates a status condition of a smart battery (e.g., the amount of charge present on the smart battery) that is plugged into an external charging unit is a two-color light emitting diode (LED). For example, an LED glows orange if the battery is less than fully charged, and green if it is fully charged. Therefore, a user has no way of determining the percentage charge present on a battery which is charging in a battery charger that is external or separate from the computer. As mentioned above, the only information which a user has is whether the battery is fully charged or not fully charged. Therefore, if a user needs to use a particular smart battery that is not yet fully charged, he or she has no idea whether the battery is only 10% charged or 90% charged. Furthermore, he or she has no way of determining how long it will take to fully charge the battery or whether such a battery is adequately charged for supplying power to an electronic device for a required duration of time.

In order to provide a user with some or all of the desired information described above, a processor is required to execute a software program which interrogates the smart battery and then displays information related to a status condition of the smart battery on a display screen, for example. It would not be cost efficient to provide a separate processor and display screen on a smart battery charger. Such a charger would be too costly to manufacture and thus too expensive for consumers.

Therefore, a system and method is needed which allows a user to take advantage of existing smart battery technology to access more specific information such as a percentage charge present on a battery, its current and voltage charging characteristics, the amount of time required to reach a fully charged state, etc., for a battery which is charging in a charging unit which is external to a computer system.

SUMMARY OF THE INVENTION

The invention addresses the above and other needs by providing a method and system for electronically coupling a computer to an external smart battery charger so as to be able to process data received from a smart battery being charged by the smart battery charger. By coupling the system management bus (SM bus) within the computer to an SM bus within the external smart battery charger, software utilities residing within the computer can be used to interrogate the smart battery which is plugged into the external charger's charging bay. The computer may then provide information related to a status condition of the smart battery to a user.

In one embodiment of the invention, a system for displaying a status condition of a smart battery, includes: a charging unit which receives and charges the smart battery; a first data bus, located within the charging unit and coupled to a microprocessor located within the smart battery; a bus interface which couples the first data bus to a second data bus; a computer having the second data bus therein, the computer further including a central processing unit, coupled to the second data bus, which receives data from the smart battery, and a display screen, coupled to the central processing unit, which displays the status condition of the smart battery, wherein the charging unit is external to the computer.

In another embodiment, a smart battery charger includes: a housing having a charging bay therein which receives and holds a smart battery; a charging circuit, located within the housing, which charges the smart battery; a first data bus, located within the housing, which provides data communications to and from a microprocessor of the smart battery when it is being charged by the charging unit; and an interface port, coupled to the housing, which provides connectivity between the first data bus and a second data bus, located within a computer, wherein the second data bus is coupled to a central processing unit of the computer, the computer further including a display screen, coupled to the central processing unit, so as to display a status condition of the smart battery.

In a further embodiment, a system for providing information, related to a smart battery being charged in a smart battery charger, to a user, includes: means for electrically coupling a microprocessor within the smart battery to a central processing unit of a computer, wherein the smart battery charger is external to the computer; means for executing a software program which interrogates the smart battery in order to obtain information related to the smart battery; and means for providing said information to the user in a specified format.

In yet another embodiment, a system for displaying a status condition of a smart battery being charged by a smart battery charger, includes: means for transmitting data from the smart battery to a computer, wherein the smart battery charger is external to the computer; means for processing said data in accordance with a software program being executed by a central processing unit within the computer; and means for displaying information obtained as a result of processing said data on a display screen coupled to the computer.

In a further embodiment, a system for displaying a status condition of a smart battery being charged by a smart battery charger, which is external to a computer, on a display screen of the computer, includes: means for providing a system management bus interface which couples a first system management bus within the smart battery charger to a second system management bus within the computer, wherein the first system management bus is coupled to a first microprocessor within the smart battery and the second system management bus is coupled to a central processing unit within the computer; means for transmitting data from the microprocessor of the smart battery to the central processing unit of the computer; means for processing said data in accordance with a software program being executed by the central processing unit; and means for displaying information obtained as a result of processing said data on the display screen of the computer, wherein said information is selected from a group comprising: a percentage charge on the smart battery relative to a fully-charged state; a time required to fully charge the smart battery; a time value corresponding to the useful life of the smart battery in its currently charged state for a specified operation; a current amplitude value for charging the smart battery; and a voltage amplitude value for charging the smart battery.

DETAILED DESCRIPTION OF THE INVENTION

The invention is described in detail below with reference to the figures, wherein like elements are referenced with like numerals throughout.

Figure 1:
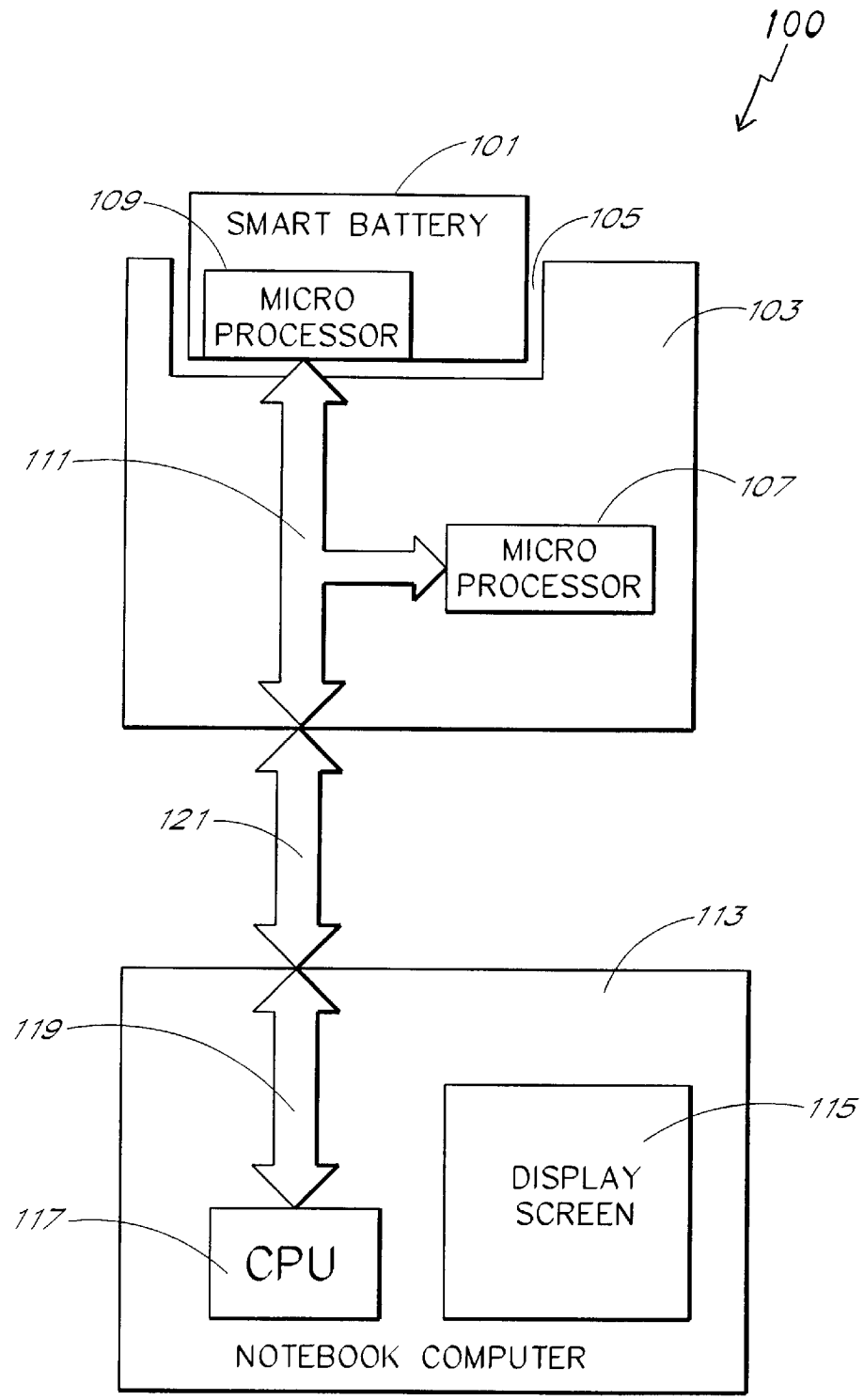
FIG. 1 is a block diagram illustrating a system for interrogating and displaying a status condition of a smart battery being charged by smart battery charger, in accordance with one embodiment of the invention.

Referring to FIG. 1, a block diagram of a system 100 for displaying a status condition of a smart battery 101 being charged in a smart battery charger 103, is illustrated. The smart battery charger 103 further includes a charging bay 105 for receiving and holding the smart battery 101 during charging of the battery 101. The charger 103 further includes a charger microprocessor 107 which communicates with a battery microprocessor 109 of the smart battery 101 via a first system management bus (SM bus) 111 of the smart battery charger 103.

As discussed above, the smart battery charger 103 periodically polls the smart battery 101 for its charging characteristics then adjusts its output to match the smart battery's requirements. This allows the battery 101 to control its own charge cycle. The smart battery charger 103 can also receive critical events from the smart battery when the battery 101 detects a problem. These include alarms for: over-charge, over-voltage, over-temperature and a temperature which is increasing too rapidly, for example.

In one embodiment, the smart battery charger 103 may be a battery charger provided within an I/O Port Replicator Unit, manufactured by Sanyo, and distributed by Micron Electronics, Inc. as model no. NBP001047-00. The I/O Port Replicator provides expandability to the existing I/O ports of a laptop, or notebook, computer. In addition to replicating the existing the I/O ports, it provides additional ports such as small computer system interface (SCSI) and ethernet/ internet ports. The Port Replicator also provides the smart battery charger 103. However, until the advent of the present invention, the Port Replicator could not provide information regarding a status condition of a smart battery being charged in its charging bay, other than providing the two-colored LED mentioned above.

The system 100 further includes a notebook computer 113 having a display screen 115, a central processing unit (CPU) 117, and a second system management bus (SM bus) 119, coupled to the CPU 117. Coupled between the first SM bus 111 of the charger 103 and the second SM bus 119 of the computer 115 is an SM bus interface 121 which electrically connects the first and second SM buses 111 and 119, respectively. Through the SM bus interface 121, the microprocessor 109 of the smart battery 101 is electrically linked to the CPU 117 of the computer 113. Therefore, the CPU 117 can communicate with the smart battery 101 as if the battery 101 were inside the computer 113 and supplying power to it. In one embodiment, the SM bus interface 121 is a two-wire bus interface which couples the two-wired SM buses 111 and 119 together.

The SM bus interface 121 may be coupled to existing pins and/or sockets on the computer 113 and to existing pins and/or sockets on the charger 103. However, if such pins and/or sockets do not exist on a particular computer or charger, it is a straight forward matter for one of ordinary skill in the art to incorporate port connector pins and/or sockets on the computer 113 and the charger 103 so as to provide electrical connectivity to the SM bus interface 121.

The CPU 117 executes a software program which interrogates the microprocessor 109 of the smart battery 103 and determines the amount of charge present on the battery and how long it will take to fully charge the battery. Additionally, the program can determine, based on a current or predetermined power consumption rate, how long a particular battery can operate given its percentage charge. The program can also control a display screen for graphically displaying the percentage charge present on the battery 101 being charged by the charger 103, for example. In one embodiment, the software program may be a program called BatteryScope™, designed and manufactured by Phoenix Technologies, Ltd., having a headquarters located at San Jose, Calif.

Figure 2:
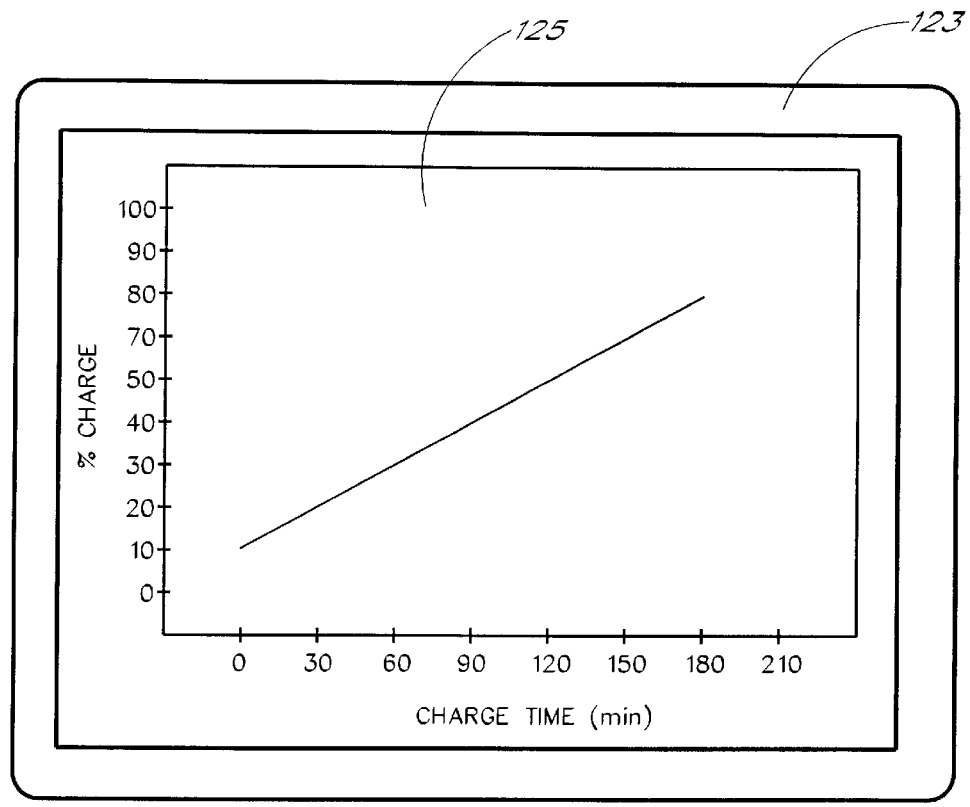
FIG. 2 illustrates a graph chart displayed by a display screen showing a percentage charge present on a smart battery being charged by a smart battery charger, in accordance with one embodiment of the invention.
Figure 3:
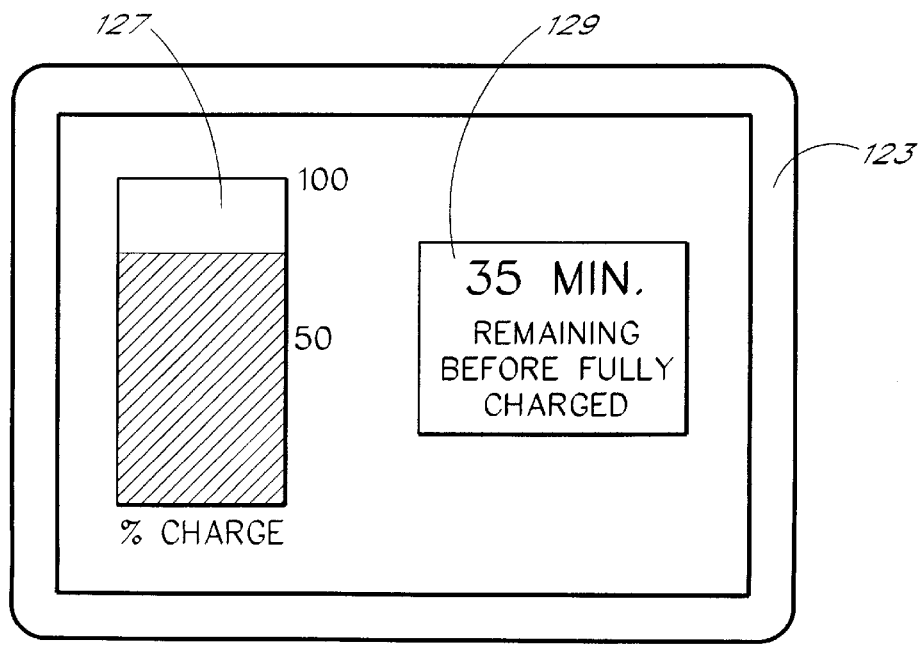
FIG. 3 illustrates another display screen showing a percentage charge present on a smart battery being charged by a smart battery charger and an amount of time left to fully charge the battery, in accordance with one embodiment of the invention.

Referring to FIG. 2, a display monitor 123 of the notebook computer 113 is illustrated. The display monitor 123 displays a graph 125 which shows a percentage (%) charge on the battery as a function of time (minutes), in accordance with one embodiment of the invention. FIG. 3 illustrates another type of screen which may be displayed by the monitor 123 of FIG. 2. A percent (%) charge gauge 127 visually depicts an amount of charge present in the battery 101 (FIG. 1) and a box 129 indicates an amount of time required to fully charge the battery 101.

The display screens, or monitors, illustrated in FIGS. 2 and 3 are only exemplary and may be only two of many types of displays which may be presented to a user in accordance with the invention. The invention is not limited to any particular style of visual display and may even provide the desired information related to a status/charging condition of the battery in audio form via a speaker system coupled to the computer 113.

As described above, the invention provides a cost efficient and effective method and system of providing to a user detailed information related to a status condition of a smart battery being charged in a smart battery charger which is external to a computer system. By electrically coupling an SM bus within the computer to an SM bus within a smart battery charger, the invention allows the charger to take advantage of existing smart battery technology. By utilizing the central processing unit and other resources of the computer, such as its display screen, the invention allows a smart battery, being charged in an external smart battery charger, to provide a user with desired status information related to the smart battery. Such status information may include: a percentage charge present on the battery, a time remaining before the battery is fully charged, an amount of time which the battery can supply power to a particular device (given the device's power consumption rate), etc.

The invention may be embodied in other specific forms without departing from its spirit or essential characteristics. The described embodiments are to be considered in all respects only as illustrative and not restrictive. The scope of the invention is, therefore, indicated by the appended claims, rather than by the foregoing description. All changes which come within the meaning and range of equivalency of the claims are to be embraced within their scope.

What is claimed is:

1. A system for displaying a status condition of a smart battery, comprising:
    a stand-alone charging unit which receives and charges the smart battery;
    a processor located in and configured to control the charging unit in response to data received from the smart battery;
    a first data bus, located within the charging unit and coupled to a processor located within the smart battery;
    a bus interface which couples the first data bus to a second data bus;
    a computer having the second data bus therein, the computer further including a central processing unit, coupled to the second data bus, which receives data representative of a status of the smart battery; and
    a display screen, coupled to the central processing unit, which displays the status condition of the smart battery.

2. The system of claim 1 wherein the first and second data buses are system management buses.

3. The system of claim 2 wherein the bus interface is a two-wire system management bus interface.

4. The system of claim 1 wherein the charging unit is a port replicator having a charging bay for receiving and charging the smart battery.

5. The system of claim 1 wherein the central processing unit executes a software program for interrogating the smart battery and processing data received from the smart battery.

6. The system of claim 5 wherein the software program determines the status condition of the smart battery.

7. The system of claim 6 wherein the status condition is chosen from a group comprising:
    a percentage charge on the smart battery relative to a fully-charged state;
    a time required to fully charge the smart battery;
    a time value corresponding to the useful life of the smart battery in its currently charged state;
    a charge current value for charging the smart battery; and
    a charge voltage value for charging the smart battery.

8. The system of claim 1 wherein said computer is a portable computer.

9. A stand-alone smart battery charger comprising:
    a stand-alone housing having a charging bay therein which receives and holds a smart battery;
    a charging circuit, located within the housing, which charges the smart battery;
    a processor located in and configured to control the charging circuit in response to data received from the smart battery
    a first data bus, located within the housing, which provides data communications to and from the processor when the smart battery is being charged by the charging unit; and
    an interface port, coupled to the housing, which provides connectivity between the first data bus and a second data bus, located within a computer configured to determine a status of the smart battery and to provide the status data to a display unit.

10. The smart battery charger of claim 9 wherein the first data bus is a first system management bus and the second data bus is a second system management bus.

11. The smart battery charger of claim 10 further comprising a system management bus interface, coupled to the interface port, so as to provide connectivity between the first and second system management buses.

12. The smart battery charger of claim 11 wherein the central processing unit executes a software program for interrogating the smart battery and processing received data from the smart battery.

13. The smart battery charger of claim 12 wherein the software program determines the status condition of the smart battery.

14. The smart battery charger of claim 13 wherein the status condition is chosen from a group comprising:
    a percentage charge on the smart battery relative to a fully-charged state;
    a time required to fully charge the smart battery;
    a time value corresponding to the useful life of the smart battery in its currently charged state for a specified operation;

a current amplitude value for charging the smart battery; and a voltage amplitude value for charging the smart battery.

15. The smart battery charger of claim 9 wherein said computer is a portable computer.

16. A system for providing information, related to a smart battery being charged in a smart battery charger, to a user, comprising:
   means for electrically coupling a microprocessor within the smart battery to a central processing unit of a computer, wherein the smart battery charger is a stand alone unit and is external to the computer;
   means for executing a software program which interrogates the smart battery in order to obtain information related to the smart battery; and
   means for providing said information to the user in a specified format.

17. The system of claim 16 wherein said means for electrically coupling comprises means for providing a system management bus interface which couples a first system management bus within the smart battery charger to a second system management bus within the computer.

18. The system of claim 16 wherein said means for providing said information comprises means for displaying said information in a graphical format on a display screen of said computer.

19. The system of claim 16 wherein said means for providing said information comprises means for sending an audio message to the user via a speaker system coupled to the computer.

20. The system of claim 16 wherein said information is selected from a group comprising:
   a percentage charge on the smart battery relative to a fully-charged state;
   a time required to fully charge the smart battery;
   a time value corresponding to the useful life of the smart battery in its currently charged state for a specified operation;
   a current amplitude value for charging the smart battery; and
   a voltage amplitude value for charging the smart battery.

21. A system for displaying a status condition of a smart battery being charged by a smart battery charger, comprising:
   means for transmitting data from the smart battery to a computer, wherein the smart battery charger is a stand alone unit and is external to the computer;
   means for processing said data in accordance with a software program being executed by a central processing unit within the computer; and
   means for displaying information obtained as a result of processing said data on a display screen coupled to the computer.

22. The system of claim 21 further comprising means for providing a system management bus interface which couples a first system management bus within the smart battery charger to a second system management bus within the computer.

23. The system of claim 6 wherein said information is selected from a group comprising:
   a percentage charge on the smart battery relative to a fully-charged state;
   a time required to fully charge the smart battery;
   a time value corresponding to the useful life of the smart battery in its currently charged state for a specified operation;
   a current amplitude value for charging the smart battery; and
   a voltage amplitude value for charging the smart battery.

24. A system for displaying a status condition of a smart battery being charged by a smart battery charger, which is external to a computer, on a display screen of the computer, comprising:
   means for providing a system management bus interface which couples a first system management bus within the smart battery charger, which charger is a stand alone unit to a second system management bus within the computer, wherein the first system management bus is coupled to a first microprocessor within the smart battery and the second system management bus is coupled to a central processing unit within the computer;
   means for transmitting data from the microprocessor of the smart battery to the central processing unit of the computer;
   means for processing said data in accordance with a software program being executed by the central processing unit; and
   means for displaying information obtained as a result of processing said data on the display screen of the computer, wherein said information is selected from a group comprising:
      a percentage charge on the smart battery relative to a fully-charged state;
      a time required to fully charge the smart battery;
      a time value corresponding to the useful life of the smart battery in its currently charged state for a specified operation;
      a current amplitude value for charging the smart battery; and
      a voltage amplitude value for charging the smart battery.

* * * * *

UNITED STATES PATENT AND TRADEMARK OFFICE
CERTIFICATE OF CORRECTION

PATENT NO. : 5,982,147

DATED : November 9, 1999

INVENTOR(S): Anderson

It is certified that error appears in the above-identified patent and that said Letters Patent is hereby corrected as shown below:

```
On the title page:
```

At [73], please delete "Boise" and insert therefore --Nampa--.

Signed and Sealed this

Twenty-second Day of May, 2001

*Attest:*

NICHOLAS P. GODICI

*Attesting Officer*      *Acting Director of the United States Patent and Trademark Office*